(12) United States Patent
Herslow

(10) Patent No.: US 10,373,920 B2
(45) Date of Patent: Aug. 6, 2019

(54) FOIL COMPOSITE CARD

(71) Applicant: COMPOSECURE, LLC, Somerset, NJ (US)

(72) Inventor: John Herslow, Scotch Plains, NJ (US)

(73) Assignee: COMPOSECURE, LLC, Mountainside, NJ (US)

( * ) Notice: Subject to any disclaimer, the term of this patent is extended or adjusted under 35 U.S.C. 154(b) by 290 days.

(21) Appl. No.: 14/183,868

(22) Filed: Feb. 19, 2014

(65) Prior Publication Data

US 2014/0166762 A1 Jun. 19, 2014

Related U.S. Application Data

(63) Continuation of application No. 12/006,168, filed on Dec. 31, 2007, now Pat. No. 9,542,635.

(51) Int. Cl.
*G06K 19/077* (2006.01)
*H01L 21/56* (2006.01)
(Continued)

(52) U.S. Cl.
CPC .......... *H01L 23/57* (2013.01); *B32B 7/12* (2013.01); *B32B 15/04* (2013.01); *B32B 37/12* (2013.01);
(Continued)

(58) Field of Classification Search
CPC ............................. G06K 19/07; H01L 21/561
See application file for complete search history.

(56) References Cited

U.S. PATENT DOCUMENTS

| 4,202,811 A | 5/1980 | Michael et al. |
| 4,354,851 A | 10/1982 | Hix et al. |

(Continued)

FOREIGN PATENT DOCUMENTS

| EP | 0368570 A2 | 5/1990 |
| JP | 2002260290 | 9/2002 |

(Continued)

OTHER PUBLICATIONS

Notice of Allowance for U.S. Appl. No. 14/977,553, dated Oct. 20, 2017, 13 pages.

(Continued)

*Primary Examiner* — Scott R. Walshon
*Assistant Examiner* — Sathavaram I Reddy
(74) *Attorney, Agent, or Firm* — RatnerPrestia

(57) ABSTRACT

Composite cards formed in accordance with the invention include a security layer comprising a hologram or diffraction grating formed at, or in, the center, or core layer, of the card. The hologram may be formed by embossing a designated area of the core layer with a diffraction pattern and depositing a thin layer of metal on the embossed layer. Additional layers may be selectively and symmetrically attached to the top and bottom surfaces of the core layer. A laser may be used to remove selected portions of the metal formed on the embossed layer, at selected stages of forming the card, to impart a selected pattern or information to the holographic region. The cards may be 'lasered' when the cards being processed are attached to, and part of, a large sheet of material, whereby the "lasering" of all the cards on the sheet can be done at the same time and relatively inexpensively. Alternatively, each card may be individually "lasered" to produce desired alpha numeric information, bar codes information or a graphic image, after the sheets are die-cut into cards.

11 Claims, 15 Drawing Sheets

(51) Int. Cl.

| | | |
|---|---|---|
| *H01L 23/00* | (2006.01) | |
| *B32B 37/12* | (2006.01) | |
| *B32B 38/06* | (2006.01) | |
| *B42D 25/41* | (2014.01) | |
| *B42D 25/328* | (2014.01) | |
| *B42D 25/425* | (2014.01) | |
| *B42D 25/435* | (2014.01) | |
| *B32B 7/12* | (2006.01) | |
| *B32B 15/04* | (2006.01) | |
| *G06K 19/06* | (2006.01) | |
| *H01L 23/498* | (2006.01) | |
| *B42D 25/373* | (2014.01) | |
| *B42D 25/47* | (2014.01) | |
| *B32B 38/10* | (2006.01) | |
| *B32B 38/00* | (2006.01) | |

(52) U.S. Cl.
CPC .......... *B32B 38/06* (2013.01); *B42D 25/328* (2014.10); *B42D 25/373* (2014.10); *B42D 25/41* (2014.10); *B42D 25/425* (2014.10); *B42D 25/435* (2014.10); *B42D 25/47* (2014.10); *G06K 19/06065* (2013.01); *G06K 19/0775* (2013.01); *G06K 19/07749* (2013.01); *H01L 21/561* (2013.01); *H01L 23/4985* (2013.01); *H01L 23/49855* (2013.01); *B32B 38/10* (2013.01); *B32B 2038/0092* (2013.01); *B32B 2310/0843* (2013.01); *B32B 2367/00* (2013.01); *B32B 2425/00* (2013.01); *B32B 2429/00* (2013.01); *H01L 2924/0002* (2013.01)

(56) References Cited

U.S. PATENT DOCUMENTS

| | | | |
|---|---|---|---|
| 4,579,754 | A | 4/1986 | Maurer et al. |
| 4,856,857 | A | 8/1989 | Takeuchi et al. |
| 5,292,616 | A | 3/1994 | Fujita et al. |
| 5,316,791 | A | 5/1994 | Farber et al. |
| 5,492,370 | A * | 2/1996 | Chatwin ............... B41M 3/14 283/107 |
| 5,895,909 | A | 4/1999 | Yoshida |
| 6,066,437 | A | 5/2000 | Kosslinger |
| 6,589,642 | B1 | 7/2003 | Miller et al. |
| 6,644,552 | B1 | 11/2003 | Herslow |
| 7,063,924 | B2 | 6/2006 | Kaminsky et al. |
| 7,287,704 | B2 | 10/2007 | Herslow |
| 8,672,232 | B2 | 3/2014 | Herslow |
| 8,725,589 | B1 | 5/2014 | Skelding et al. |
| 8,944,810 | B2 | 2/2015 | Herslow |
| 9,016,591 | B2 | 4/2015 | Herslow et al. |
| 9,390,363 | B1 | 7/2016 | Herslow et al. |
| 9,390,366 | B1 | 7/2016 | Herslow et al. |
| 9,422,435 | B2 | 8/2016 | Posey |
| 9,542,635 | B2 | 1/2017 | Herslow |
| 9,569,718 | B2 | 2/2017 | Herslow |
| 2001/0049004 | A1 | 12/2001 | Wilkie |
| 2002/0014297 | A1 | 2/2002 | Mott et al. |
| 2002/0015897 | A1 | 2/2002 | Toshine et al. |
| 2003/0107709 | A1 | 6/2003 | Redick |
| 2003/0234286 | A1 | 12/2003 | Labrec et al. |
| 2004/0031855 | A1 | 2/2004 | Takahashi |
| 2004/0217178 | A1 | 11/2004 | Lasch et al. |
| 2004/0218273 | A1 * | 11/2004 | Mimura ............... G02B 5/124 359/530 |
| 2005/0045729 | A1 * | 3/2005 | Yamazaki .......... G06K 19/0704 235/492 |
| 2005/0189066 | A1 | 9/2005 | Look et al. |
| 2005/0252604 | A1 | 11/2005 | Smulson |
| 2006/0172136 | A1 | 8/2006 | Komori et al. |
| 2006/0292946 | A1 | 12/2006 | Kickhaefer |
| 2007/0089831 | A1 | 4/2007 | Fiorentino et al. |
| 2008/0152797 | A1 | 6/2008 | Biondi et al. |
| 2008/0213551 | A1 | 9/2008 | Funicelli et al. |
| 2009/0169776 | A1 | 7/2009 | Herslow |
| 2009/0315316 | A1 | 12/2009 | Staub et al. |
| 2010/0230154 | A1 | 9/2010 | Naito et al. |
| 2011/0020606 | A1 | 1/2011 | Herslow et al. |
| 2012/0328875 | A1 | 12/2012 | Schoneveld et al. |
| 2014/0224881 | A1 | 8/2014 | Herslow |
| 2015/0136856 | A1 | 5/2015 | Herslow et al. |
| 2015/0180229 | A1 | 6/2015 | Herslow |
| 2015/0206047 | A1 | 7/2015 | Herslow et al. |
| 2015/0339564 | A1 | 11/2015 | Herslow et al. |
| 2016/0180212 | A1 | 6/2016 | Herslow et al. |

FOREIGN PATENT DOCUMENTS

| | | |
|---|---|---|
| KR | 1020040104545 | 12/2004 |
| WO | 2012002992 A1 | 1/2012 |
| WO | 2016073473 A1 | 5/2016 |

OTHER PUBLICATIONS

Non Final Office Action for U.S. Appl. No. 14/178,436, dated Nov. 29, 2017, 24 pages.
Extended European Search Report for European Application No. 14752098.5, dated Feb. 3, 2017, 8 pages.
Communication Pursuant to Rules 70(2) and 70a(2)EPC for European Application No. 14752098.5, dated Feb. 21, 2017, 1 page.
International Search Report and Written Opinion of the International Searching Authority for International Application No. PCT/US2014/15939, dated Aug. 25, 2014, 10 pages.
Entire patent prosecution history of U.S. Appl. No. 14/178,436, filed Feb. 12, 2014, entitled, "Durable Card."
Entire patent prosecution history of U.S. Appl. No. 15/355,018, filed Nov. 17, 2016, entitled, "Foil Composite Card."
Entire patent prosecution history of U.S. Appl. No. 15/356,586, filed Nov. 19, 2016, entitled, "Foil Composite Card."
Entire patent prosecution history of U.S. Appl. No. 15/637,092, filed Jun. 29, 2017, entitled "Durable Card".
Entire patent prosecution history of U.S. Appl. No. 12/006,168, filed Dec. 31, 2007, now U.S. Pat. No. 9,542,635, issued Jan. 10, 2017, entitled: Foil Composite Card.
Entire patent prosecution history of U.S. Appl. No. 15/521,519, filed Apr. 24, 2017, entitled "Ceramic-Containing and Ceramic Composite Transaction Cards".
Entire patent prosecution history of U.S. Appl. No. 14/718,596, filed May 21, 2015, entitled "Transaction and ID Cards Having Selected Texture and Coloring".
Entire patent prosecution history of U.S. Appl. No. 15/379,569, filed Jun. 15, 2016, entitled "Transaction and ID Cards Having Selected Texture and Coloring".
Entire patent prosecution history of U.S. Appl. No. 12/460,829, filed Jan. 27, 2011, entitled "Card with Embedded Image".
Entire patent prosecution history of U.S. Appl. No. 14/977,553, filed Dec. 21, 2015, entitled "Smart Metal Card With Radio Frequency (RF) Transmission Capability".
European Communication for EP Application No. 14752098.5, dated Jan. 16, 2018, 3 pages.
Non Final Office Action for U.S. Appl. No. 15/356,586, dated Apr. 2, 2018, 34 pages.
Final Office Action for U.S. Appl. No. 15/356,586, dated Sep. 13, 2018, 22 pages.
Non Final Office Action for U.S. Appl. No. 14/178,436, dated Oct. 4, 2018, 23 pages.
Non Final Office Action for U.S. Appl. No. 15/637,092, dated Nov. 1, 2018, 48 pages.
Non Final Office Action for U.S. Appl. No. 15/355,018, dated Oct. 29, 2018, 30 pages.
Non Final Office Action for U.S. Appl. No. 12/460,829, dated Nov. 13, 2018, 13 pages.

* cited by examiner

STEP 1

STEP 2A  Form diffraction pattern on one side of layer 21 (embossing step).

STEP 2B  Vapor deposition of aluminum on pattern

STEP 3  Apply primer (adhesive) coat 2 sides.

STEP 4  Apply PE adhesive and Buffer and cut sheets to image.

STEP 1

STEP 1A   Adding embossing layer

STEP 2A   Form diffraction pattern in embossing layer.

FOIL COMPOSITE CARD

This application is a continuation application of my co-pending application Ser. No. 12/006,168 filed Dec. 31, 2007 and titled Foil Composite Card, the contents of which are incorporated herein by reference.

BACKGROUND OF THE INVENTION

The invention is directed to the manufacture of a multi-layered (composite) card, or any like instrument or document.

The term "card" or "cards" as used herein, and in the appended claims, is intended to include a large variety of documents and instruments such as a financial cards, identification (including a National ID or Driver's License) cards, electronic passport pages, gift cards, documents for holding permanent and long lasting records such as medical records or security cards, or other plastic cards used for promotion of a product or organization.

Various means of producing an improved composite card are disclosed in U.S. Pat. No. 6,644,552, titled Composite Card and issued to John Herslow, the applicant of this application, the teachings of which are incorporated herein by reference. However, there remains a demand for increasing the security of the cards (documents and/or instruments) being formed and used. For example, FIG. 4 of the '552 patent, shows security elements formed in a top layer 17 and FIG. 6 of the '552 patent discusses the addition of holographic material and other security indicia after the sheets are cut into standard cards.

Thus, to increase the security of a card, it is known to form holograms on the card. Generally, the holograms may be formed by a hot stamping method at, or near, the top (or bottom) surface (level) of the card. A disadvantage to so placing the holograms is that a counterfeiter may be able to alter the card without the tampering being readily apparent to someone examining or accepting the card. Also, positioning the hologram close to the top or the bottom surface of the card creates an asymmetry in its construction, whereby, when the temperature varies, different portions (layers) of the card may be placed under different degrees of tension and contraction resulting in stresses which tend to distort the card and/or the hologram (e.g., the card fails to remain flat). Still further, when the hologram is placed at, or near, the top or the bottom surfaces it may be easily and inadvertently scratched or marred.

Due to the highly sensitive nature of the "secure" cards, of interest, it is critical that they be made tamper resistant and sturdy and to last for a long time (e.g., more than 5 years) even where high temperature levels (hot or cold) and a high degree of humidity are encountered. It is also desirable that they be relatively inexpensive to fabricate and, very importantly, that the card be virtually impossible to be altered without destroying the card or the easy detection of the alteration.

SUMMARY OF THE INVENTION

Accordingly, composite cards formed in accordance with the invention include a security layer formed at the center, or core layer, of the cards. Cards embodying the invention may include a hologram, or diffraction grating formed at, or in, the center, or core layer, of the card with symmetrical layers formed above and below the center or core layer.

A hologram may be formed by embossing a designated area of the core layer with a diffraction pattern and vapor depositing a very thin layer of metal or metal compound (e.g., aluminum, zinc sulfide, etc . . . ) on the embossed layer. Then, additional layers are selectively attached to the top and bottom surfaces of the core layer. In accordance with the invention, for each additional layer attached to the top surface of the core layer there is a corresponding like layer attached to the bottom surface of the core layer for producing a highly symmetrical structure (sandwich).

In accordance with one embodiment of the invention, all the layers are made of a clear synthetic (e.g., plastic) material, whereby the pattern formed on, or within, the core layer may be seen by looking down at the top of the card or by looking up at the bottom of the card.

The layer of metal or metal compound deposited on the core layer may be made very thin to provide a "see-through" effect, under appropriate light conditions. However, where the layer of metal or metal compound deposited on the core layer is of "standard" thickness, the pattern may only be seen from the top or the bottom side of the core.

After the hologram is formed, a laser may be used to remove selected portions of the metal formed on the embossed layer to impart a selected pattern or information to the holographic region. In accordance with the invention, this step in making a card or a set of cards may be performed when the card or cards being processed are attached to, and part of, a large sheet of material, whereby the "lasering" of all the cards on the sheet can be done at the same time and relatively inexpensively.

In accordance with the invention a hologram may be formed in the core portion of card and if the hologram includes a metal layer, laser equipment may be used to modify and/or alter the metal pattern at selected stages in the process of forming the card. Alternatively, after the sheets are die-cut into cards, each card may be individually "lasered" to produce desired alpha numeric information, bar codes information or a graphic image.

Embodiments of the invention may include the use of a polyester film, or any other carrier, which includes a metallic or a high refractive index (HRI) transparent holographic foil that is pre-laminated between two sheets of a material (which could be PVC, PET or other thermo-plastic resin) that has a thermo-plastic adhesive (which may have, but not necessarily has, been previously applied). The pre-laminated holographic foil can have an unlimited number of patterns and may also be configured to include one, or several individual, hologram designs repeated in rows and columns across an entire sheet. The holographic design may also have the appearance of full metal, or partial metal and partial white coverage (white reflecting hologram) on each individual card in the matrix. Utilizing this holographic foil pre-laminate in concert with standard plastic card materials, enables a plastic card manufacturer to produce "full-face" foil pattern design cards, or "full-face" registered hologram cards.

These cards would include the holographic foil pre-laminate as the center sheet in a standard card composition. Utilizing the center sheet composition with a metal layer, the subsequent plastic card could be laser engraved using a standard YAG laser or any other suitable laser, thus removing the metal or material coatings of the holographic layer in one or more of the following: an alpha numeric, barcode or graphic design. The end result is an inexpensive foil composite card that has a unique individualized holographic layer that has been permanently altered.

If a potential counterfeiter attempted to disassemble the card in order to compromise the integrity of the information contained on, or in, the card, it would cause a change in the hologram resulting in the hologram being irreparably damaged. Therefore, plastic cards formed in accordance with the invention are truly tamper resistant and are more secure foil cards than any of the known commercially available cards.

BRIEF DESCRIPTION OF THE DRAWINGS

In the accompanying drawings (which are not drawn to scale) like reference characters denote like components, and.

DETAILED DESCRIPTION OF THE PREFERRED EMBODIMENTS

Figure 1:
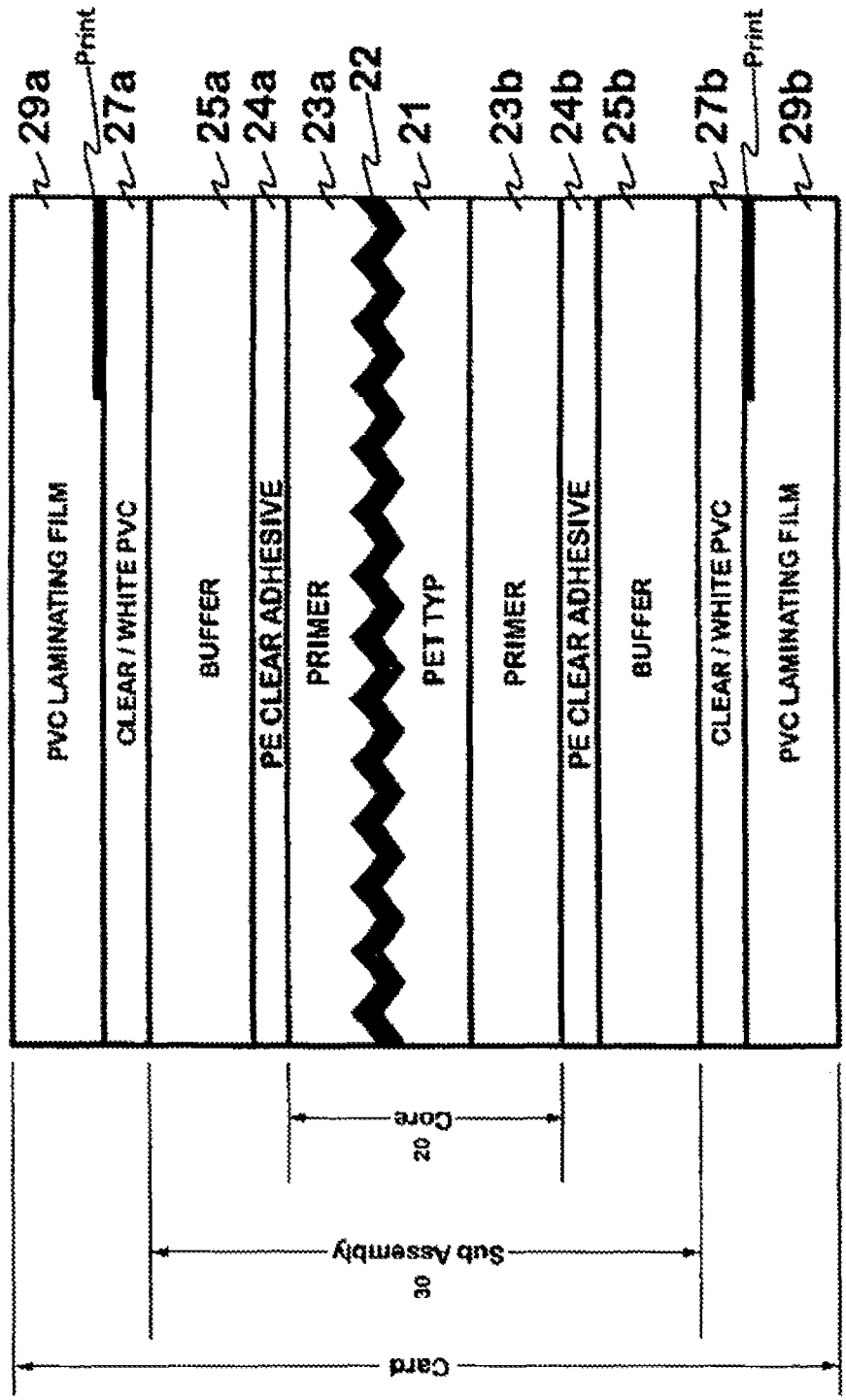
FIG. 1 is a cross sectional diagram of part of a card (instrument) embodying the invention.
Figure 2:
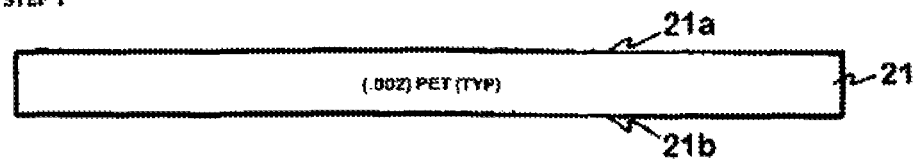
FIG. 2 is a diagram detailing some of the steps in forming a card embodying the invention.
Figure 2:
Figure 2:
Figure 2:
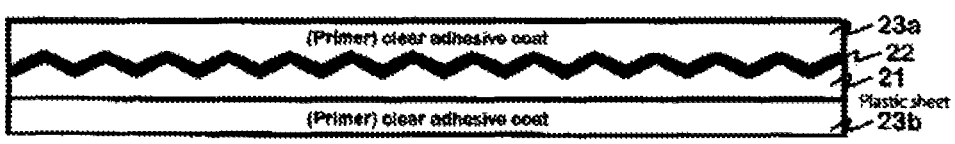
Figure 2:
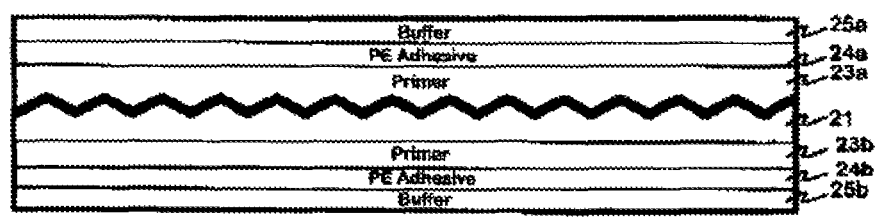
Figure 2A:
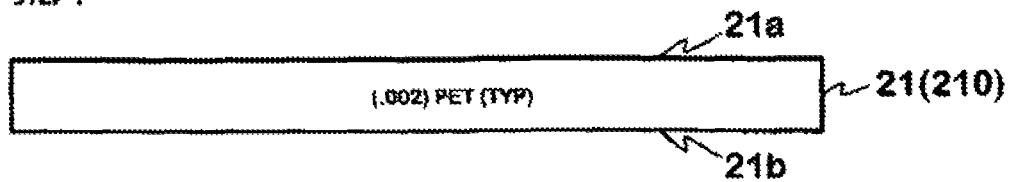
FIG. 2A is a diagram detailing the application of an embossing layer to a core layer to form a card embodying the invention.
Figure 2A:
Figure 2A:
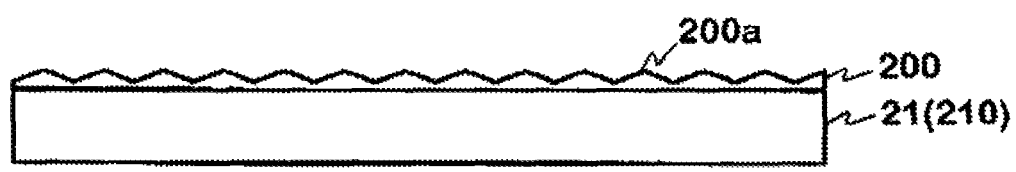

Referring to FIGS. 1, 2 and 2A, there is shown a core 20 comprised of a base layer 21 of a plastic material, which may be, for example, oriented polyester terephthalate (OPET) or polypropylene, or polystyrene, or any number of acrylics and/or a combination of these materials. The base layer 21 is shown to have an upper surface 21a and a lower, or bottom, surface 21b. For purpose of illustration, a pattern is shown to be formed on, or above, surface 21a of layer 21. However it should be understood that, alternatively, the pattern could be formed on surface 21b. Two different methods of forming a pattern are shown in FIGS. 2 and 2A. The surface 21a of layer 21 in FIG. 2 is embossed with a diffractive or holographic pattern. In FIG. 2A, the surface 21a of layer 21 is coated with an embossing layer 200 which is then embossed with a diffractive pattern, 200a.

A layer 22 of aluminum (or any suitable metal or metal compound such as Zinc Sulfide) may then be vapor deposited on the diffraction pattern to form a hologram. The use of vapor deposition is very significant in that it permits a very thin layer 22, a few atoms thick, to be formed on surface 21a and thus complete the formation of the hologram, using small amounts of metal. Using vapor deposition, the thickness of the layer can be made very thin so it is nearly transparent and can provide a "see-through" effect. Alternatively, the metal layer can be made a little thicker so as to be more opaque.

As detailed in step 3 of FIG. 2, a clear adhesive primer layer 23a, may be coated over the patterned and metallized top surface (21a) and a similar clear adhesive primer layer 23b may be coated over the bottom surface (21b) of the layer 21. The core 20 is completed by attaching these clear adhering layer (23a, 23b) above and below the embossed base layer 21. The clear layer 23a, 23b, is a primer coating. It may be polyethyleneamine or an acrylic based, or other, organic adhesive compound with solvent or water based carriers. The primer coatings 23a, 23b are fairly thin and yet fairly strong/sturdy. They also function to promote adhesion to layers 24a, 24b which are attached to the core 20.

As detailed in step 4 of FIG. 2 clear PE adhesive layers 24a, 24b may then be formed/attached to the top (outer) surfaces of their respectively layers 23a, 23b. Layers 24a, 24b may be of polyethylene (PE) material, or polypropylene (PP), or high density polypropylene (HDPP), or ethylene Vinyl Acetate (EVA), or any of the different forms of PET or any of like materials, or mixtures of these materials. The clear materials used to form layers 24a, 24b may contain other clear adhesion promoting compounds (e.g., ethyl acrylates, acrylic acid, etc . . . ). The layers 24a, 24b may be fairly thick and function to attach to the thin embossed hologram layer and coatings of core 20. For handling purposes, buffer layers 25a, 25b may then be formed/attached to the top (outer) surfaces of layers 24a, 24b to complete what is defined as subassembly 30. For example, buffer (carrier) layer (25a, 25b) may be laminated to the top and bottom of adhesive layers 24a, 24b. Subassembly 30, is thick enough to be handled by automatic credit card manufacturing equipment.

In one embodiment, the base layer 21 was approximately 0.002 inches thick and the adhesive backed layers (23a, 23b) were each made to be approximately 0.0001 to 0.0003 inches thick. In other embodiments the layers 23a, 23b could be made either thinner or much thicker.

In still other embodiments, adhesive layers can be coated over the buffer or carrier layer and the two (i.e., the carrier and buffer layers on each side of a holographic layer) can be combined with the holographic layer. That is, adhesive can be applied to either side of the carrier foil interface and then pre-laminated together (3 sheets laminated to become one laminate; i.e., the prelaminate prior to platen lamination. Thus, the carrier sheet can hold the sub-assemblies for transfer to substrates for forming cards.

Examining FIG. 2 in greater detail note some of the steps used in forming the core 20.

As shown, for example, in step 1, the base component may be a sheet 21 of plastic (e.g., PET or OPET or polypropylene, or polystyrene, or polymethyl, methacrylate, etc . . . ) material whose thickness typically ranges from 0.0005 inches to more than 0.005 inches. In one embodiment layer 21 was made, for example, 0.002 inches thick.

Then, as shown in step 2A, which may be termed an embossing step, a diffraction pattern may be formed on one side of layer 21. A diffraction pattern may be formed directly in the plastic layer 21 by embossing (e.g., stamping) pattern(s) therein. Forming the pattern in a sheet of plastic (or in an embossing layer, as discussed below) is easier and less wearing on the embossing (stamping) equipment than forming a like pattern in a metal layer.

Then, as shown in step 2B a hologram is formed on one surface (21a) of plastic sheet 21 by vapor deposition of a metal layer (e.g., aluminum onto the diffraction pattern. Thus, the hologram may be formed by embossing the top surface 21a to form a diffraction pattern and then metallizing the pattern. The surface 21a may be coated by the vapor deposition of aluminum (or similar light reflective materials such as nickel, silver, zinc, or other like materials). A significant advantage of using vapor deposition (although many other methods may be used) is that very small amounts of the metal (light reflective material) need to be used to form the hologram resulting in a significant savings in the cost of manufacturing the card (or instrument). Also, very thin layers allow a controllable amount of light to pass through. This enables the manufacture of a card, or document, in which an image (hologram) formed on a card is reflected (i.e., is visible) while also enabling a viewer to "see-through" the image.

Then, as shown in step 3 of FIG. 2, clear adhesive or "primer" coats 23a, 23b may be applied to the top and bottom surfaces 21a, 21b, respectively, of plastic sheet 21. The primer coat also functions to fill in the ridges resulting from the formation of the diffraction grating. The clear layers 23a, 23b which may be of the type described above, may be attached to the top and bottom surfaces of "embossed" plastic sheet 21 on which the aluminum has been vapor deposited. Primer layers 23a, 23b may be attached to base layer 21 by any one of a number of methods, such as, for example, gravure coating, roller coating, flexography or other like methods. The primer secures the bond to both sides of the holographic sheet (the embossed side and the blank side). This completes the formation of what is defined herein as the core assembly 20.

Then, as shown in step 4 of FIG. 2, the PE layers 24a, 24b, or any other suitable layer, as noted above, which function as an additional buffer between that bond and the outer buffer layers 25a, 25b are attached to the core assembly. The PE layers 24a, 24b may also include an adhesive which promotes adhesion to the clear primer layers 23a, 23b attached to the top and bottom surfaces of layer 21. Layers 24a, 24b, 25a, 25b may be attached to each other and to the underlying layers by any one of a number of methods such as, for example, platen lamination, hot roll lamination, liquid adhesive lamination.

Thus, as shown in step 4 of FIG. 2, a clear buffer layer 25a is attached to the PE layer 24a and a clear buffer layer 25b is attached to the PE adhesive layer 24b. All of layers 24a and 24b and layers 25a, 25b function as buffers, providing additional strength to the structure and at the same time protecting the hologram from being damaged or tampered with. Adding layers 25a and 25b completes the sub-assembly 30 which may then be customized to form cards with additional information.

By forming the hologram at, and within, the core level, the hologram will not be easily, or inadvertently, damaged since several additional layers will be attached to the top and bottom of the holographic layer. It is also not subject to easily being tampered or altered. Forming the hologram at the center of the structure minimizes the possibility of tampering while fully protecting the hologram. Another significant advantage of forming the hologram at the core of the structure is that the top and bottom surfaces stay flat due to equal shrinking and/or expansion of all the layers. Note that the card structure is formed so as to be symmetrical about the core layer.

FIG. 2A illustrates another method of forming the hologram. As shown in Step 1A of FIG. 2A, a clear embossing layer 200 may be coated directly over a layer 21 (or 210). Alternatively, a primer coating may be formed on layer 21/210 and then the embossing layer 200 may attached/formed to the primer coating. The embossing layer may be composed, for example, of siloxane, acrylic, vinyl, linear polyester, urethane or any like materials and may be several (e.g., less than 0.5 to more than 5) microns thick. The embossing layers may also be deposited as liquids and radiation cured, possibly in two steps—first as a soft easily embossable coating which then becomes hard and impervious. As shown in step 2A of FIG. 2A, a diffraction pattern is embossed (formed) in the embossing layer/coating 200 to form a desired pattern. Forming a pattern in the embossing layer may be desirable since it is even easier and less wearing on the embossing (stamping) equipment than forming a like pattern directly in the PET layer (as per FIG. 2). After the pattern is embossed on and within the embossing layer 200, the sheet may be processed as per steps 2B, 3 and 4 shown in FIG. 2.

[Note that a hologram may be formed by, for example, embossing a pattern in a carrier base material (e.g., a hard polyester) or by embossing the pattern in a coating previously applied to the carrier base material, or by embossing the pattern in a metal which was previously deposited onto the base carrier material or by depositing the metal onto a soft coating and then embossing.]

Referring back to FIG. 1, note that the core 20 may be part of a subassembly 30 which includes attaching layers 24a, 24b of clear PE and buffer layers 25a, 25b to the top and bottom surfaces of the core 20. Layers 25a, 25b, may range in thickness from 0.001 to 0.005 inches, or more, and may be composed of PVC like materials.

The subassembly 30 may then be used to form a card, or any instrument, by attaching a layer 27a, 27b of clear or white PVC material to the top and bottom surfaces of the subassembly 30. As illustrated in FIG. 1, information can be printed either on the outer surface (the surface facing away form the core) of layers 27a, 27b or on the inner surface or both. The printed information may include, for example, fixed data fields and advertising, and/or any other desired information. The card (or instrument) may be completed by adding clear PVC laminating films 29a, 29b to the top and bottom surfaces of the card.

Figure 3:
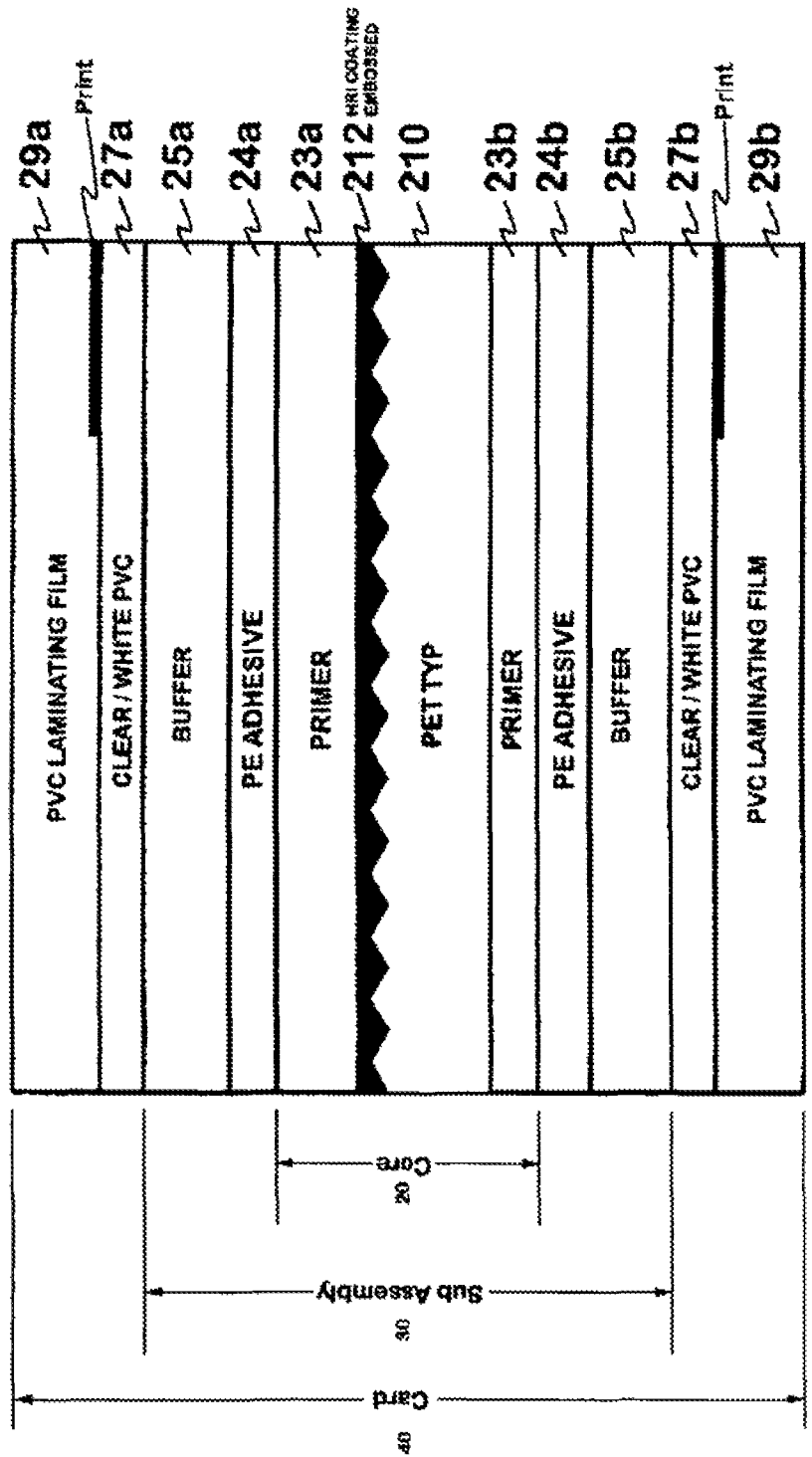
FIG. 3 is a cross sectional diagram of part of a card embodying the invention where the core layer includes a transparent material having a high refractive index.
Figure 3A:
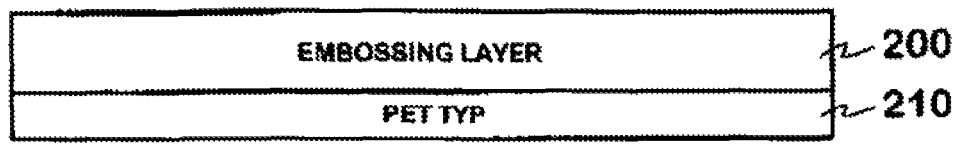
FIGS. 3a, 3b, 3c, 3d, are cross sectional diagrams of steps in forming a card embodying the invention.
Figure 3B:
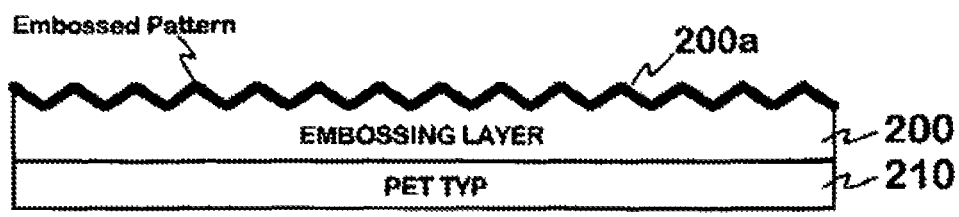
Figure 3C:
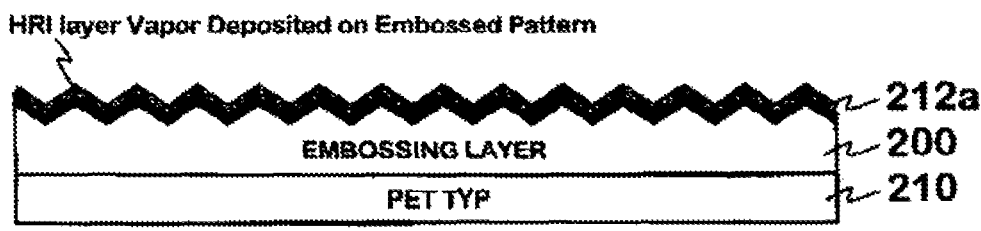
Figure 3D:
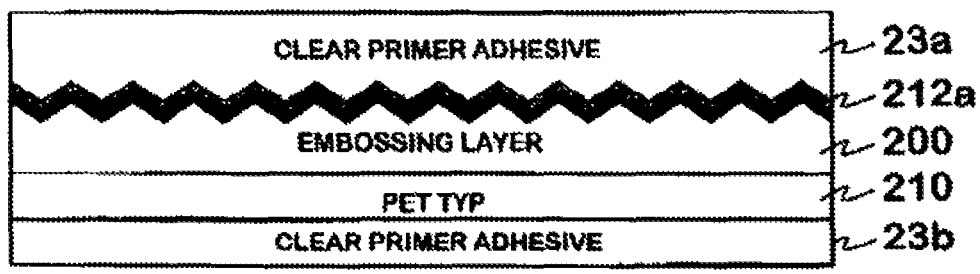

FIG. 3 is a cross-sectional diagram (not to scale) of a card embodying the invention. FIG. 3 includes a core comprised of a layer 210 which may be (but not be) of the same material as layer 21. In FIG. 3, the top surface 210a of layer 210 is embossed with a diffraction pattern giving a unique pattern to the structure. A high refractive index (HRI) layer 212 can then be vapor deposited on the embossed layer. Due to the HRI property of layer 212, there is no need to further metallize the layer. The HRI layer may be formed of zinc sulfide or zinc oxide or any material having like properties. Clear primer layer 23a is attached to the top of HRI layer 212 overlying layer 210 and primer layer 23b is attached to the bottom of layer 210.

Then, as shown in FIG. 1, clear layers 24a and 24b, which may be of PE or any other suitable materials, are attached to layers 23a and 23b, respectively and additional layers (25a, 25b) of clear (translucent) material may be attached to the top and bottom layers of layers 24a, 24b to form the subassembly 30. Additional layers 27a, 27b may be attached to the top and bottom layers of the sub-assembly. Information may be written or printed in any known manner on, or in, the layers 27a, 27b. Subsequently, laminating films 29a, 29b, may be attached to the top and bottom intermediate layers 27a, 27b to produce a card 40 whose core contents can not be altered without essentially destroying the card.

FIGS. 3A, 3B, 3C, 3D and 3E illustrate the forming/coating of an embossing layer 200 on stock (e.g., PET) material 210 (FIG. 3A), then embossing layer 200 with a diffraction pattern 200a (FIG. 3B), then vapor depositing an HRI layer 212a on the diffraction pattern (FIG. 3C), then coating clear primer layers 23a, 23b above layer 212a and below layer 210 (FIG. 3D) to form a core assembly 20. Then clear PE adhesive layer 24a is formed above prime layer 23a and clear PE adhesive layer 24b, is formed below layer 23b (FIG. 3E). Note that the steps and thicknesses of the layers to form the basic structures discussed above are summarized in Table I, below.

Figure 4:
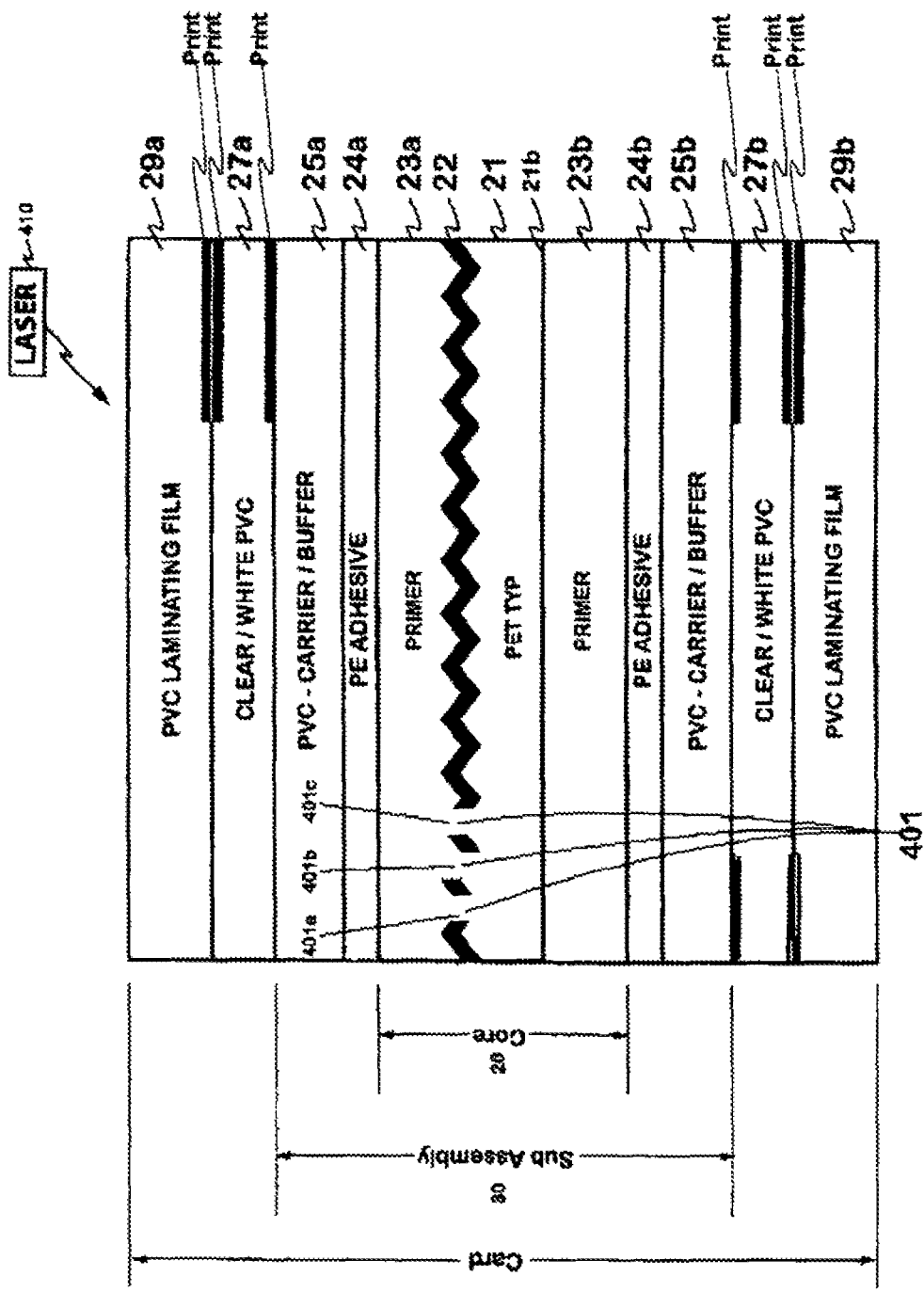
FIG. 4 is a diagram of the cross section of part of a card embodying the invention to which a laser beam is applied to form an additional ablated pattern in a metal layer in accordance with the invention.

FIG. 4 includes a cross-sectional diagram (not to scale) of a portion of a card embodying the invention, which may be part of a sheet (not shown) on which a large number of cards are formed, and depicts a piece of laser equipment 410 for "lasering" (e.g., engraving or vaporizing) metal layer 22. The core assembly 20 is shown to have a layer 22 of aluminum deposited and embossed as discussed for FIGS. 1, 2, and 2A, above. Portions of the metal layer may be vaporized (see sections 401a, 401b, 401c) by the laser equipment 410 such that portions of the metal are selectively removed or "ablated" by "lasering" (e.g., eliminating or vaporizing) the metal to form any number of different patterns (e.g., graphic as well as alpha numeric information may be generated). The clear layers 29a, 27a, 25a and 24a may be selected to be transparent to the laser wavelength. Consequently, the laser beam can pass through the clear layers of the card to "write" on the holographic layer below the top surface of the card. The laser 410 may be applied at several different stages of the card manufacturing process to form the desired patterns. Thus, the laser may be applied to "write" on the metal layer after the core 20 is formed and before the attachment of the carrier layers 24a, 24b and 25a, 25b. Alternatively, the laser 410 may be applied to form the desired pattern in the metal layer after the layers 24a, 24b, and 25a, 25b are attached to the core layer, and before layers 27a and 27b are attached. Still further, the laser may be applied to form the desired pattern in the metal layer after the layers 27a, 27b are attached and before the layer 29a, 29b, are attached. Finally, the laser may be applied to form the desired pattern in the metal layer after the layers 29a, 29b are attached, when the cards may be part of a full sheet or in individual card shape.

Figure 5:
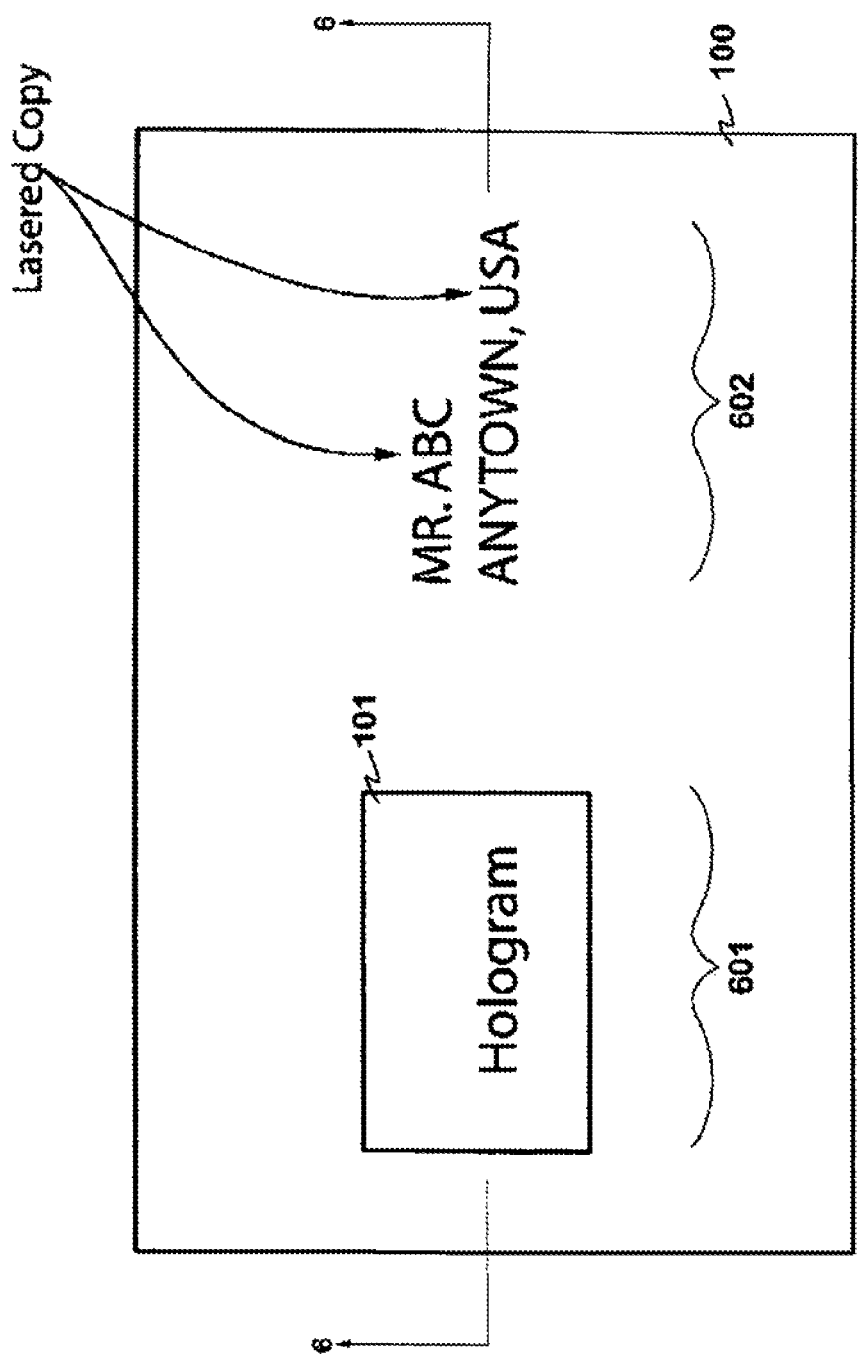
FIG. 5 is a diagram of a top view of a card including a holographic portion formed in accordance with the invention.

FIG. 5 shows a top view of a card 100 illustrating that the hologram may be located within a designated window or area 101, shown in portion 601. Alternatively the hologram may extend the full length and/or width of the card 100. Note that alpha numeric information may be produced by lasering within the holographic layer (e.g., layer 22 in FIG. 4 shown in portion 602). Also, alpha numeric information may be produced by printing information on, or within, layers 27a, 27b, as discussed above.

Figure 6:
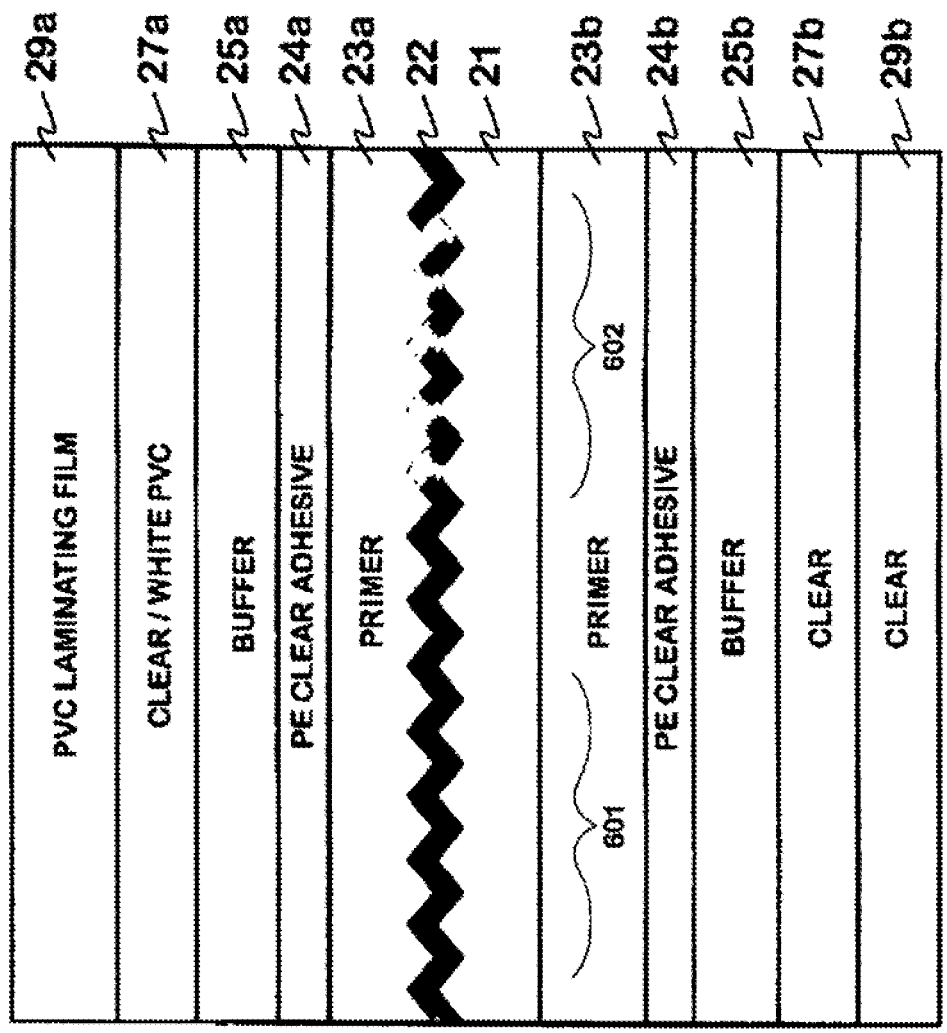
FIG. 6 is a cross sectional diagram of a card shown in FIG. 5 where all layers are made of clear (transparent) materials.

FIG. 6 is a cross-sectional diagram (not to scale) of card 100 of FIG. 5 and is intended to show that the layers above and below the holographic layer, 21, 22/212, may be transparent or translucent to yield a "see-through" card with the hologram portion 601 and the lasered portion 602 being visible from the top side or from the bottom side of the card. Note that if layers 27a, 27b are made of a white material a bright light may be needed to observe the "see-through" effect.

Figure 6A:
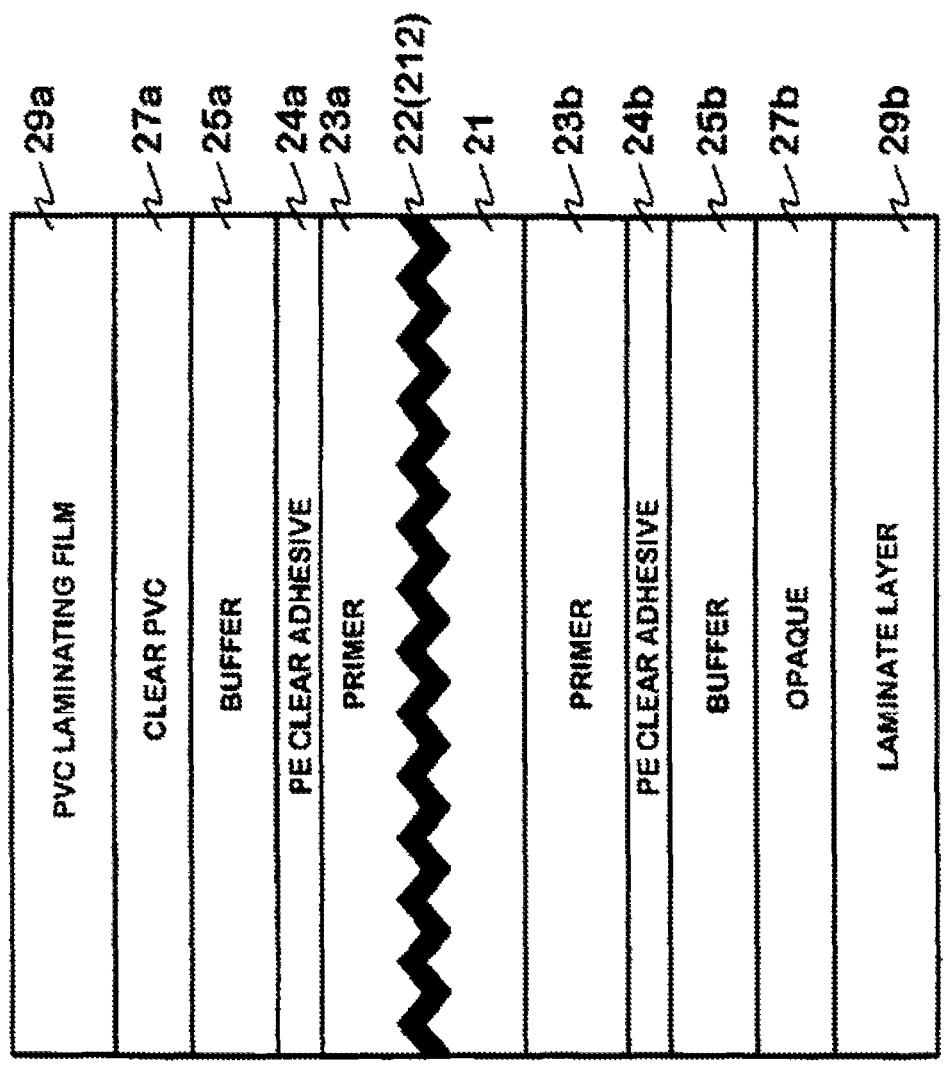
FIG. 6A is a cross sectional diagram of a card embodying the invention where one, or more, of the layers block the light.

FIG. 6A is a cross-sectional diagram (not to scale) intended to show that the layers above the holographic layer 21, 22/212, may be transparent or translucent so the holographic pattern may be seen from the top. At the same time, one or more of the layers below the holographic layer (e.g., 27b or 29b) may be opaque so as to block the hologram from being seen from the bottom. Making the top portion of the card transparent and the bottom portion opaque is by way of illustration and the reverse could be done instead.

Figure 7:
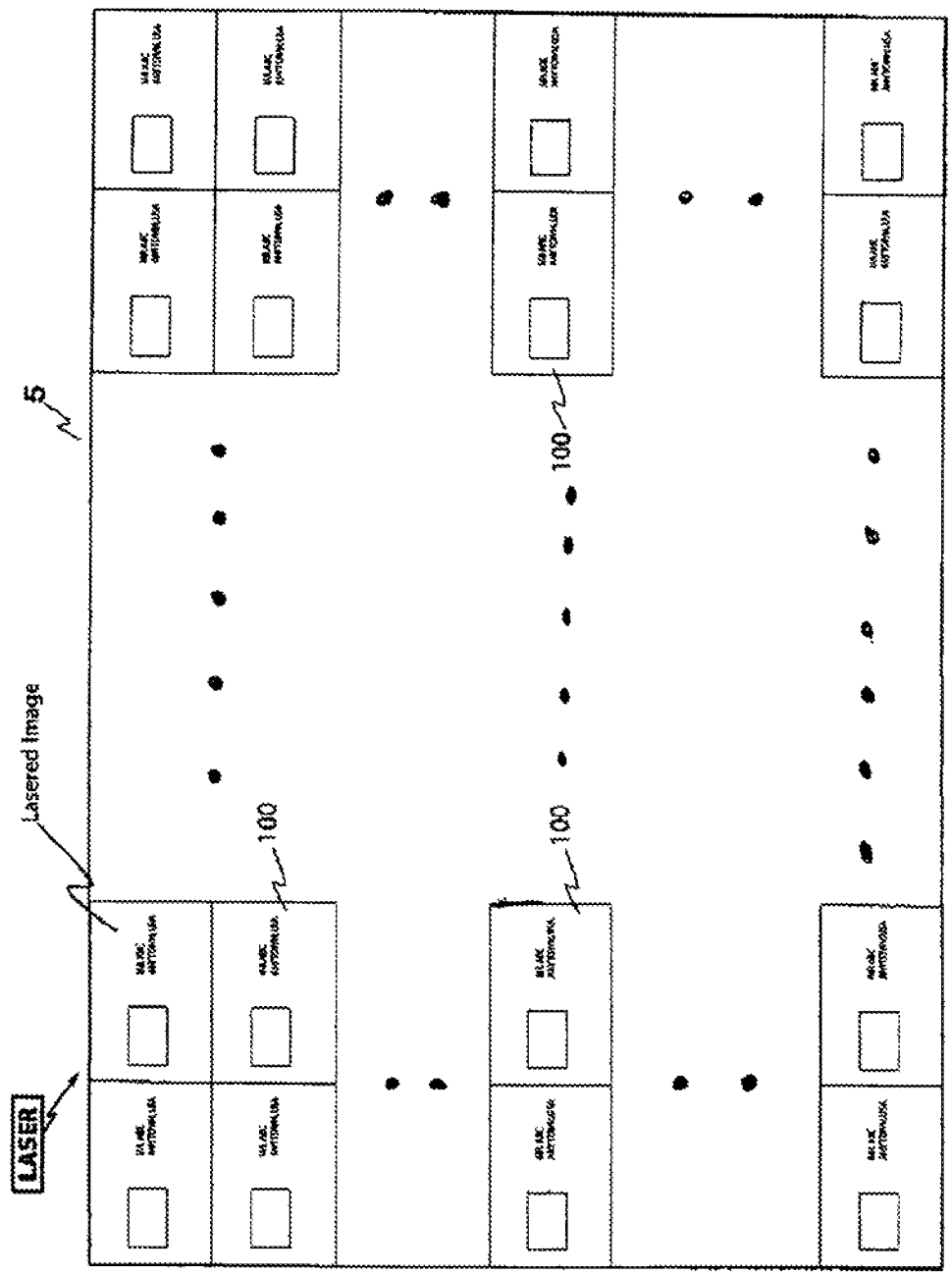
FIG. 7 is a top view of a sheet containing an array of cards illustrating that a laser beam can be applied to all of the cards on the sheet.

FIG. 7 shows the application of a laser beam generated by laser equipment 410 to a sheet 5 containing a large array of cards 100 in sheet form embodying the invention. The laser may be applied to the entire sheet of cards which may be at the core stage, the sub-assembly stage, or any of the stages thereafter. Being able to apply the laser beam in this manner, at any time before the cards are separated from a sheet, is economically advantageous and saves much in the cost of handling and also adds significant additional security.

Figure 8:
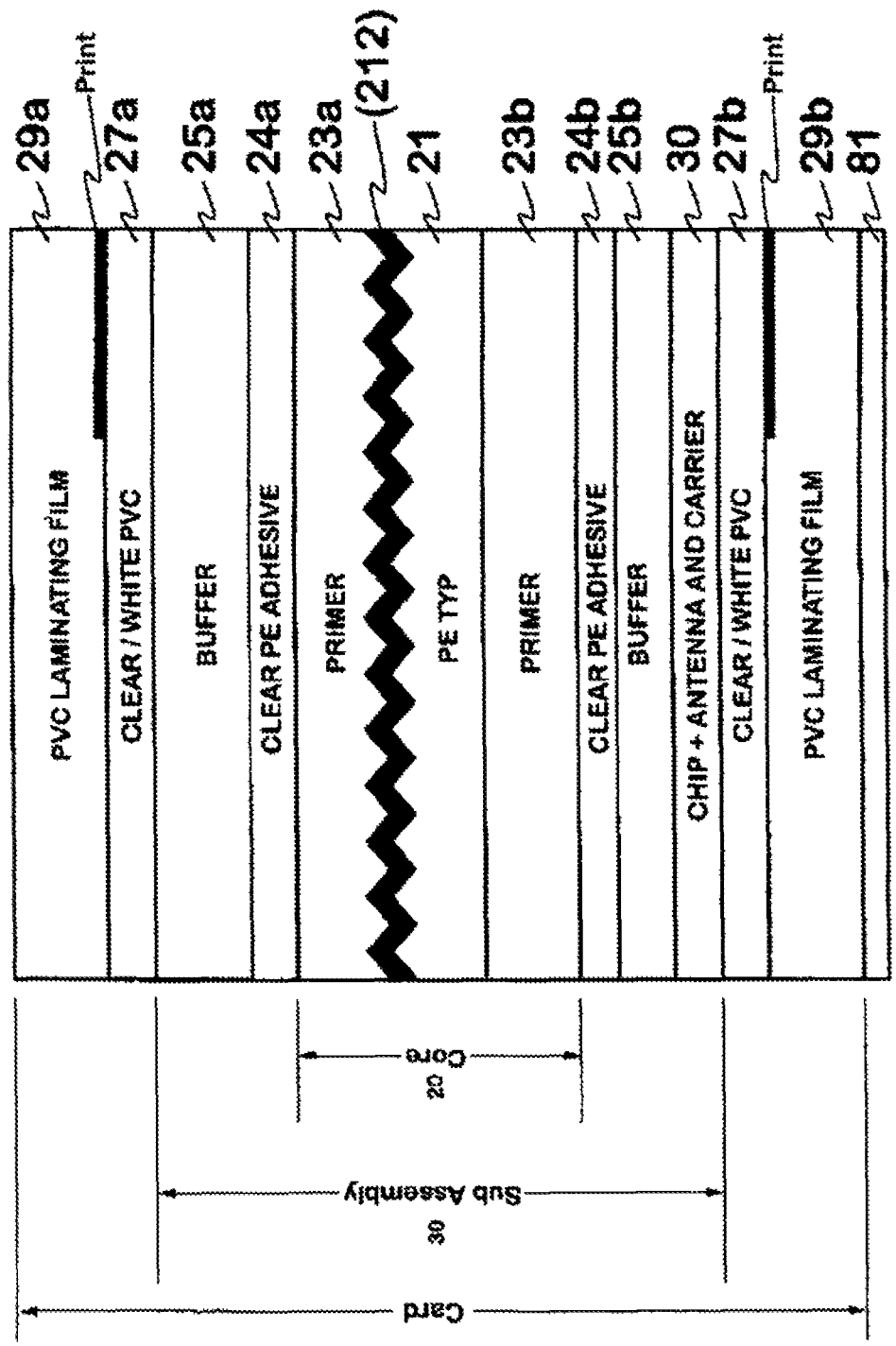
FIG. 8 is a cross sectional diagram of a card with an integrated circuit (IC) chip and antenna embodying the invention.

FIG. 8 illustrates that cards embodying the invention, shown in the various figures, may be modified by the addition of a semiconductor chip containing selected electronic circuits (an integrated circuit, IC) within the body of the card in, or within, a layer 30 dedicated to include an antenna carrier, with the antenna being connected to the chip module. This enables the manufacture of a radio frequency identification (RFID) card. Note that the metal layer 22/212 can act as a radio frequency shield to reduce reception from that side of the RFID antenna.

Figure 9:
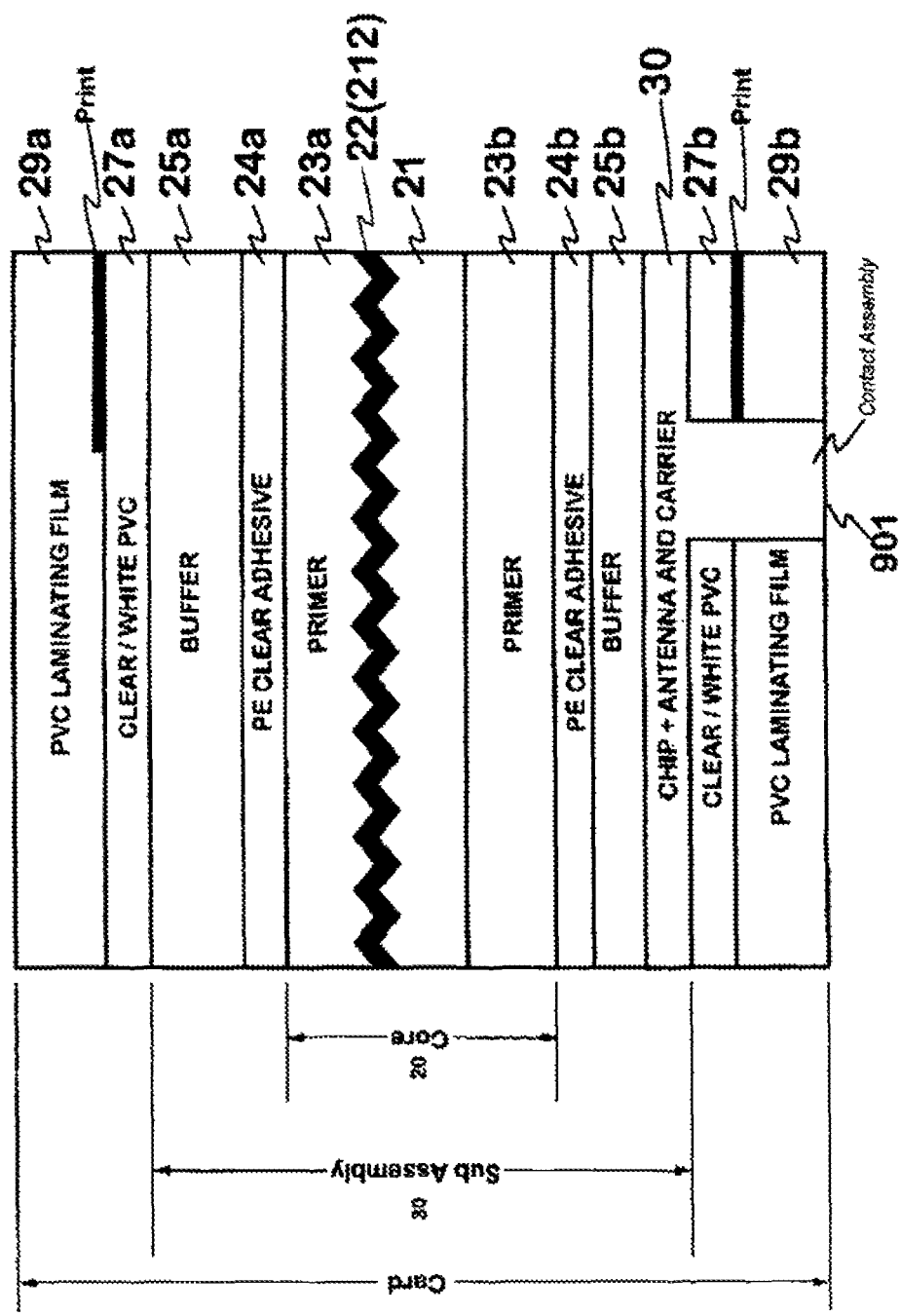
FIG. 9 is a cross sectional diagram of a dual interface card embodying the invention.

FIG. 9 illustrates that the chip (IC) and an antenna and carrier may be formed within a layer of the card and that, in addition, the chip may be accessed (read) by providing an external contact 901 along one side of the card. This type of card may be referred to as a dual interface card since it enables information on the card to be read or written via RFID and contact.

Figure 10:
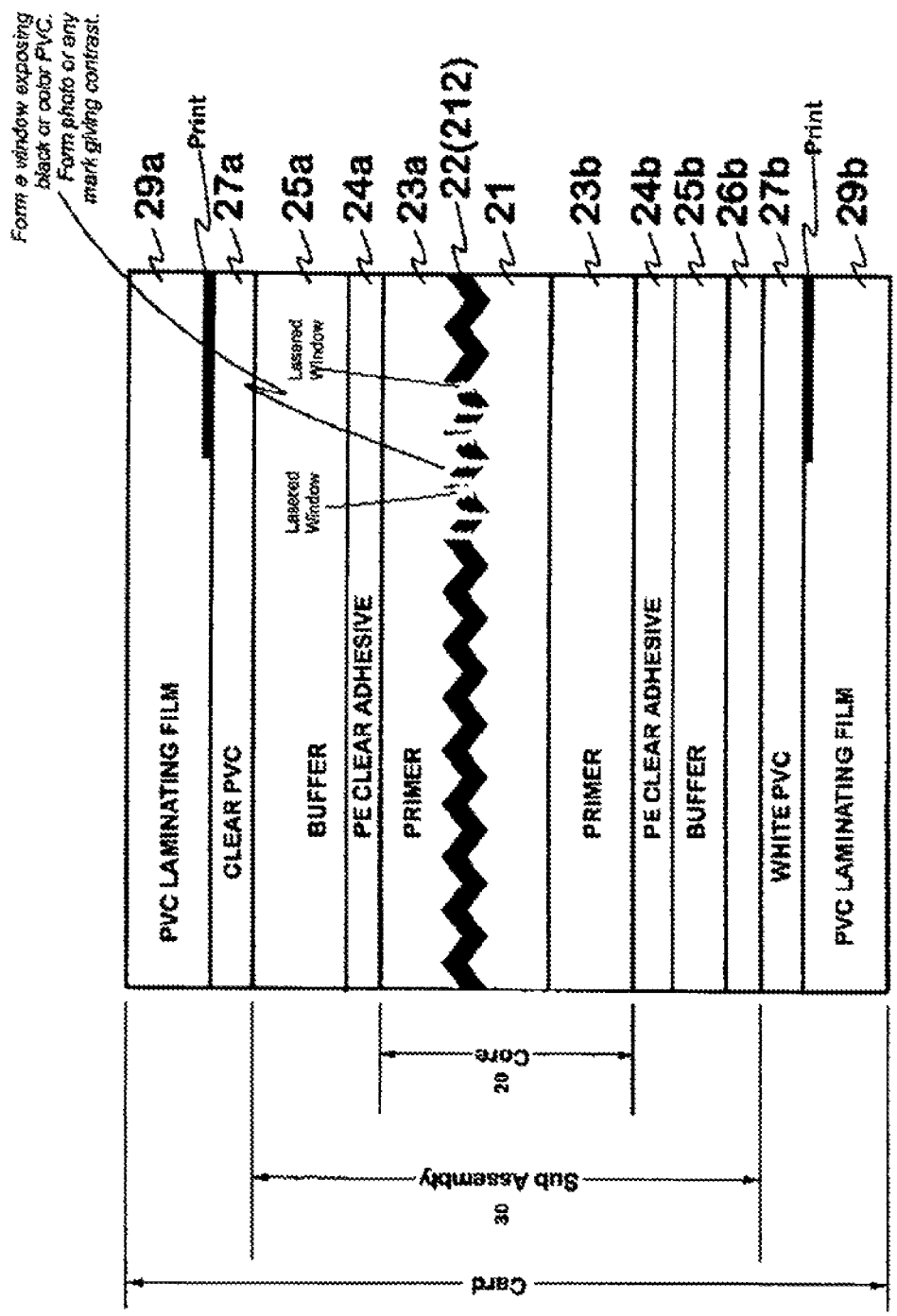
FIG. 10 is a cross sectional diagram of a card with a lasered window embodying the invention.

FIG. 10 illustrates that a window or opening can be formed by lasering through the metal layer within core layer 20 to enable the color or pattern of an underlying layer (e.g., 27b) to be seen from the top side of the card. Lasering through the metal layer forms (or opens) a window exposing an underlying layer (e.g., 27b) which may be black or white or colored or be of any preset pattern.

Figure 11:
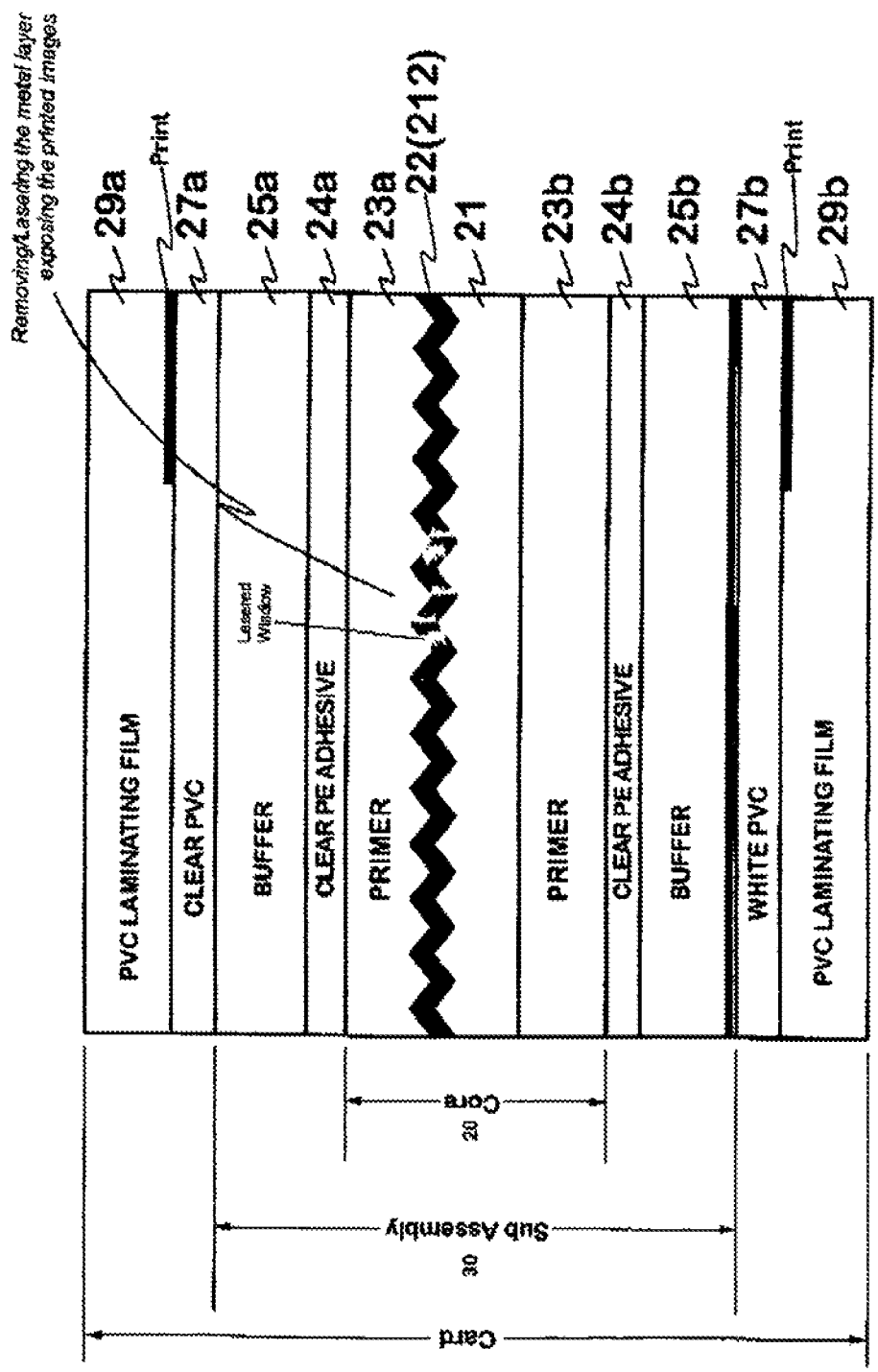
FIG. 11 is a cross sectional diagram of another card with a lasered window embodying the invention.

FIG. 11 illustrates that a window or opening can be formed by lasering the metal layer within core layer 20 to enable a preprinted image formed on an underlying layer (e.g., 27b) to be seen from the top side of the card. Here again lasering through the metal layer forms a window enabling the seeing or reading of a pre-printed pattern on an underlying layer (e.g., 27b).

Figure 12:
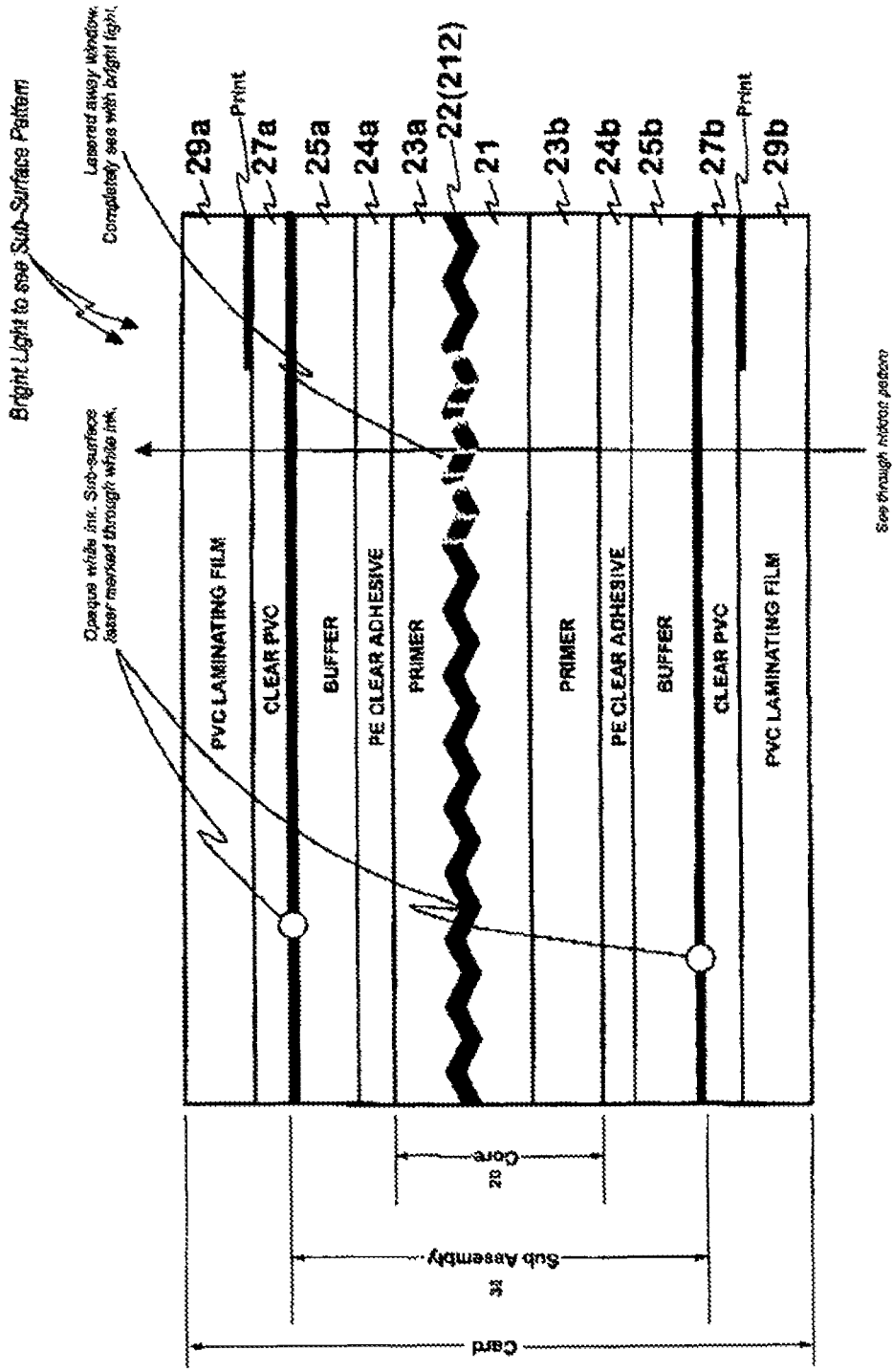
FIG. 12 is a cross sectional diagram of still another card with a lasered window embodying the invention.

FIG. 12 illustrates that a window or opening can be formed by lasering through the metal layer within core layer 20 to provide a "see-through" condition. That is, lasering through the metal layer forms a window which provides visibility through both sides (top and bottom) of the card. This may be viewed by applying a light source such as a flashlight in direct contact with one side of the card and viewing the light pattern on the other side.

TABLE I

Example of Steps and materials in forming core, sub assembly and card

| step | I | II | III | IV |
|---|---|---|---|---|
| 1 | Start with base/central layer 21 of PET/OPET material | Start with base/central layer 21/210 of PET/OPET material | Start with base/central layer 21 of PET/OPET material | Start with base/central layer 21/210 of PET/OPET material |
| 1A | | Deposit embossing layer 200 on one surface of layer 21/210 | | Deposit embossing layer 200 on one surface of layer 21/210 |
| 2 | Emboss one surface of base layer 21 with pattern | Emboss top surface of embossing layer 200 with pattern 200a | Emboss one surface of base layer 21 with pattern | Emboss top surface of embossing layer 200 with pattern 200a |
| 3 | Vapor deposition of metal 22 on pattern | Vapor deposition of metal 22 on pattern | Vapor deposition of HRI coating 212 on pattern | Vapor deposition of HRI coating 212 on pattern |
| 4 | Apply clear primer coats 23a, 23b to top and bottom Thickness: .00002-.0002 | Apply clear primer coats 23a, 23b to top and bottom Thickness: .00002-.0002 | Apply clear primer coats 23a, 23b to top and bottom Thickness: .00002-.0002 | Apply primer clear coats 23a, 23b to top and bottom Where primer coat 23a, 23b Thickness: .00002-.0002 |
| 5. | Form clear PE adhesive layers 24a, 24b-fairly thick, sticky Thickness: .0005-.005 | Form clear PE adhesive layers 24a, 24b fairly thick, sticky Thickness: .0005-.005 | Form clear PE adhesive layers 24a, 24b fairly thick, sticky Thickness: .0005-.005 | Form clear PE adhesive layers 24a, 24b fairly thick, sticky Thickness: .0005-.005 |
| 6. | Form clear buffer layer 25a, 25b of PVC material thickness .0008-.005 | Form clear buffer layer 25a, 25b of PVC material thickness .0008-.005 | Form clear buffer layer 25a, 25b of PVC material thickness .0008-.005 | Form clear buffer layer 25a, 25b of PVC material thickness .0008-.005 |
| 7. | Form clear white PVC layer white PVC layer 27a, 27b Thickness .004 to .012 | Form clear white PVC layer 27a, 27b Thickness .004 to .012 | Form clear white PVC layer 27a, 27b Thickness .004 to .012 | Form clear white PVC layer 27a, 27b Thickness .004 to .012 |
| 8. | Form PVC laminating film 29a, 29b Thickness .0008 to .005 | Form PVC laminating film 29a, 29b Thickness .0008 to .005 | Form PVC laminating film 29a, 29b Thickness .0008 to .005 | Form PVC laminating film 29a, 29b Thickness .0008 to .005 |

All dimensions in inches

What is claimed is:

1. A multilayered composite card comprising:
   a base plastic layer having top and bottom surfaces;
   an embossed metallic layer having an embossed pattern formed on the top surface of said base plastic layer;
   first and second clear primer layers;
   said first clear primer layer attached to the embossed metallic layer and the second clear primer layer attached to the bottom surface of the base plastic layer;
   wherein a central core region of said multilayered composite card is defined by said first clear primer layer, said embossed metallic layer, said base plastic layer, and said second clear primer layer;
   first and second buffer layers;
   said first buffer layer attached to said first clear primer layer and said second buffer layer disposed between said second clear primer layer and a carrier layer; and
   said carrier layer comprising an integrated circuit (IC) containing electronic circuitry connected to an antenna configured to enable contactless radio frequency (RF) communication,
   wherein said embossed metallic layer acts as a radio frequency shield that reduces wireless receptivity of the antenna from a side of the antenna facing the embossed metallic layer and includes at least one window formed within the embossed pattern.

2. The multilayered composite card as claimed in claim 1 wherein said at least one window formed in the embossed metallic layer is formed by lasering the metallic layer.

3. The multilayered composite card as claimed in claim 1, wherein said carrier layer is a plastic layer;
   further including first and second additional plastic layers, the first additional plastic layer attached to the first buffer layer and the second additional plastic layer attached to the carrier layer, and
   graphic material printed on selected ones of said carrier layer, said base plastic layer or said first or second additional plastic layers.

4. The multilayered composite card as claimed in claim 1, further including an electrical contact assembly on one side of the multilayered composite card in electrical communication with the IC and operative to enable the IC to be accessed by direct contact via said contact assembly.

5. The multilayered composite card as claimed in claim 1, wherein said embossed metallic layer has one or more patterns.

6. The multilayered composite card as claimed in claim 1, wherein said embossed metallic layer is disposed on said base plastic layer, a first buffer plastic layer is disposed above said embossed metallic layer, and a second buffer plastic layer is formed below said base plastic layer, and wherein said carrier layer comprises a plastic layer attached to the second buffer plastic layer formed below the base plastic layer.

7. The multilayered composite card of claim 1, further comprising a plastic layer having information selectively written thereon, and the at least one window is formed within the embossed pattern to enable visibility of the selected information.

8. The multilayered composite card of claim 1 further comprising a first clear plastic layer having information selectively written thereon, and which is attached to the first buffer layer; and
 a second clear plastic layer having information selectively written thereon, and which is attached to the second buffer layer,
 wherein the at least one window is formed within the embossed pattern to enable visibility of the information.

9. A card comprising:
 a core subassembly;
 a plurality of additional layers stacked with, and attached to, said core subassembly;
 an integrated circuit (IC) containing selected electronic circuits mounted on, or within, one of said plurality of additional layers;
 an antenna located on, or within, one of said plurality of additional layers, said antenna connected to said IC and configured to enable contactless radio frequency communication with an external device; and
 wherein the core subassembly comprises an embossed metallic layer having an embossed pattern formed on a top surface of a base plastic layer, wherein said embossed metallic layer includes at least one window formed within the embossed pattern, and acts as a radio frequency shield that reduces wireless receptivity of the antenna from a side of the antenna facing the embossed metallic layer.

10. The card as claimed in claim 9, wherein the at least one window is a laser-formed window.

11. A multilayered composite card comprising:
 a base plastic layer having top and bottom surfaces;
 an embossed metallic layer with a predetermined embossed pattern formed within the top surface of said base plastic layer;
 first and second clear primer layers, said first clear primer layer attached to the embossed metallic layer and the second clear primer layer attached to the bottom surface of the base plastic layer, wherein a central core region of said multilayered composite card is defined by said first clear primer layer, said embossed metallic layer, said base plastic layer, and said second clear primer layer;
 a first set of additional protective and buffer layers and a second set of additional protective and buffer layers; said first set attached to the first clear primer layer and the second set attached to the second clear primer layer; and
 a carrier layer mounted within said second set, said carrier layer including an integrated circuit (IC) containing electronic circuitry connected to an antenna configured to enable contactless radio frequency (RF) communication,
 wherein said embossed metallic layer acts as a radio frequency shield that reduces wireless receptivity of the antenna from a side of the antenna facing the embossed metallic layer and includes at least one window formed within the embossed pattern.

* * * * *